United States Patent [19]

Tanaka et al.

[11] Patent Number: 4,833,067
[45] Date of Patent: May 23, 1989

[54] DEVELOPING SOLUTION FOR POSITIVE-WORKING PHOTORESIST COMPRISING TMAH AND NON-IONIC SURFACTANT

[75] Inventors: Hatsuyuki Tanaka, Samukawa; Hidekatsu Kohara, Chigasaki; Yoshiyuki Sato, Samukawa; Shingo Asaumi, Fujisawa; Toshimasa Nakayama, Hiratsuka; Akira Yokota, Yamato; Hisashi Nakane, Yokohama, all of Japan

[73] Assignee: Tokyo Ohka Kogyo Co., Ltd., Kawasaki, Japan

[21] Appl. No.: 246,930

[22] Filed: Sep. 19, 1988

Related U.S. Application Data

[63] Continuation of Ser. No. 892,645, Aug. 4, 1986, abandoned.

[30] Foreign Application Priority Data

Aug. 6, 1985 [JP] Japan ................................ 60-171835

[51] Int. Cl.$^4$ .......................... G03C 5/18; G03C 5/24
[52] U.S. Cl. .................................... 430/331; 430/309; 430/323; 430/325
[58] Field of Search ............... 430/331, 323, 325, 309

[56] References Cited

U.S. PATENT DOCUMENTS

| | | | |
|---|---|---|---|
| 4,239,661 | 12/1980 | Muraoka | 430/326 |
| 4,374,920 | 2/1983 | Wanat et al. | 430/331 |
| 4,603,058 | 7/1986 | Adams | 430/331 |
| 4,610,953 | 9/1986 | Hashimoto et al. | 430/331 |
| 4,613,561 | 9/1986 | Lewis | 430/331 |

FOREIGN PATENT DOCUMENTS

| | | | |
|---|---|---|---|
| 58-9143 | 4/1973 | Japan . | |
| 58-57128 | 9/1973 | Japan . | |
| 58-150949 | 12/1973 | Japan . | |
| 60-12547 | 4/1975 | Japan . | |
| 0223120 | 11/1985 | Japan | 430/331 |
| 1367830 | 9/1974 | United Kingdom | 430/331 |

Primary Examiner—Paul R. Michl
Assistant Examiner—Patrick A. Doody
Attorney, Agent, or Firm—Armstrong, Nikaido, Marmelstein, Kubovcik & Murray

[57] ABSTRACT

The aqueous developing solution of the invention for positive-working photoresist compositions contains, in addition to an organic basic compound free from metallic ions, such as tetramethyl ammonium hydroxide and choline, as the principal ingredient, from 50 to 5000 ppm of an acetylene alcohol. In comparison with conventional developing solutions, the inventive developing solution is advantageous in the uniformity of the patterned photoresist layer, higher sensitivity and smaller temperature dependency of development and less drawbacks due to foaming of the solution.

1 Claim, 1 Drawing Sheet

FIGURE
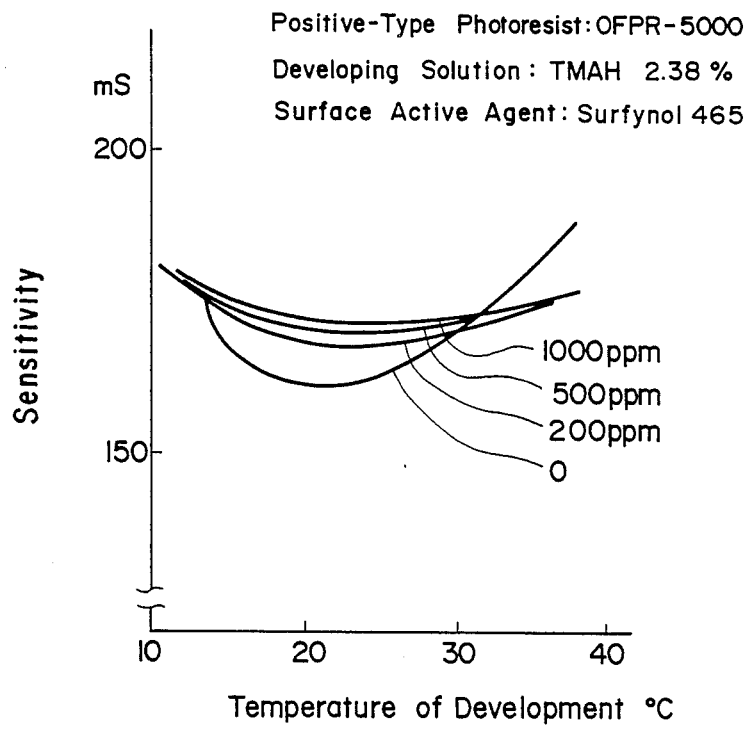

DEVELOPING SOLUTION FOR POSITIVE-WORKING PHOTORESIST COMPRISING TMAH AND NON-IONIC SURFACTANT

This application is a continuation division of application Ser. No. 892,645 filed Aug. 4, 1986 now abandoned.

BACKGROUND INVENTION

The present invention relates to a developing solution for positive-working photoresist or, more particularly, to a developing solution suitable for use in patterning of a quinone diazide-based positive-working photoresist. The developing solution is imparted with wettability of the surface of the photoresist layer and dissolving selectivity between the exposed areas and unexposed areas improved so much that no defects are caused in the developed pattern of the photoresist layer. Further, development with the developing solution can be performed with little temperature dependency of dissolution in the exposed areas of the photoresist layer and with few drawbacks due to foaming.

In the conventional procedures for the manufacture of semiconductor IC devices, photomasks for the manufacture of ICs, printed circuit boards and the like, the substrate plate is subjected to a selective treatment before etching, diffusion and other treatment. With an object to selectively protect certain areas of the substrate surface which should be left intact by the treatment in this case, it is usually undertaken that a coating film is formed on the substrate surface with a composition sensitive to actinic rays such as ultraviolet light, X-rays, electron beams and the like, which is called a photoresist, followed by pattern-wise exposure of the coating film to the actinic rays and development to form a patterned photoresist layer.

Photoresist compositions are classified into positive-working and negative-working ones depending on the change in the solubility behavior by the exposure to actinic rays. Namely, the positive-working photoresist is imparted with increased solubility in a developing solution in the exposed areas and remains insoluble in the unexposed areas while the negative-working photoresist behaves inversely. Typical positive-working photoresist compositions currently on use include combinations of an alkali-soluble novolac resin as the base ingredient and a naphthoquinone diazide compound as a photosensitizer. While such a naphthoquinone diazide-based positive-working photoresist can be developed with an alkaline aqueous solution as the developing solution, alkaline aqueous solutions containing metal ions are undesirable as a developing solution in the manufacture of semiconductor devices because the metal ions may adversely influence the performance of the semiconductor devices processed by the development therewith. Accordingly, developing solutions containing no metal ions should be used in such a case as exemplified by an aqueous solution of tetramethyl ammonium hydroxide disclosed in IBM Technical Disclosure Bulletin, volume 13, No. 7, page 2009 (1970) and an aqueous solution of choline disclosed in U.S. Pat. No. 4,239,661.

The apparatuses of development currently used in the manufacture of integrated circuits are mostly designed for performing stationary development in order to facilitate automatization of the photoresist processing in which a developing solution is dripped and spread on the surface of a semiconductor silicon wafer coated with a layer of a photoresist composition and, after standing as such for a while, the developing solution is dripped again so that the whole process of development proceeds with the wafer kept stationary throughout. In such a process of stationary development, the spreading velocity of the developing solution over the whole surface of the wafer is the key factor which is determinant of the uniformity of the photoresist layer on the wafer surface. This problem of spreadability of the developing solution over the wafer surface is more important when the silicon wafer has a larger and larger diameter so that the wettability of the developing solution is one of the most important characteristics required of the solution.

In this regard of improving the wettability for a developing solution, it is a known and industrially practiced method that the developing solution is admixed with a surface active agent as is disclosed in Japanese Patent Kokai 58-57128. This method of adding a surface active agent to the developing solution, however, is not quite satisfactory because foams are sometimes formed on the developing solution admixed with a surface active agent which may cause defects in the patterned photoresist layer after development. Although foaming of the solution can be prevented by the addition of a defoaming agent, highly effective defoaming agents such as silicone-based ones cannot be used because they are sometimes responsible for defective development. When a developing solution for positive-working photoresist compositions is admixed with a surface active agent, in particular, a serious problem is caused in that the temperature dependency of development is increased with enhanced sensitivity at an increased temperature and reduction of film thickness in the unexposed areas.

Besides, one of the important characteristics required of a developing solution for positive-working photoresist compositions is the so-called dissolving selectivity that dissolution of the photoresist layer is complete in the exposed areas while the photoresist layer in the unexposed areas should be left intact by the developing solution with an as small as possible change in the film thickness by the development. According to the disclosure in Japanese Patent Kokai 58-9143 and 58-150949, improvements in this regard can be obtained by the addition of a surface active agent of a quaternary ammonium type or a quaternary ammonium salt, respectively. Further, Japanese Patent Kokai No. 60-12547 teaches that contrast of a positive-working photoresist composition can be increased when it is developed using a developing solution containing an alkali metal-containing basic compound and a fluorinecontaining surface active agent in combination. This method, however, is far from industrial practicability in the manufacture of semiconductor-based integrated circuits because alkali metal compounds ar detrimental to the performance of semiconductor devices in addition to the problem that patterned photoresist layers with reliability can hardly be obtained due to the increased temperature dependency in the power of the developing solution.

SUMMARY OF THE INVENTION

An object of the present invention is therefore to provide a developing solution suitable for patterning of a naphthoquinone diazide-based photoresist layer free from the above described problems and disadvantages in the conventional developing solutions. Namely, the object of the invention is to provide a developing solution imparted with greatly improved wettability on the surface of a photoresist layer and increased dissolving selectivity between the exposed and unexposed areas of the photoresist layer to cause no defects in the patterning by the development. Further, the object of the invention is to provide a developing solution with little temperature dependency of the dissolving power in the exposed areas and free from the disadvantage of foaming so as to be quite satisfactorily used in the manufacture of semiconductor devices.

The present invention has been completed on the basis of a discovery arrived at as a result of the extensive investigations that admixture of a conventional developing solution for positive-working photoresist compositions with an acetylene alcohol-based surface active agent is very effective to achieve the above mentioned objects.

Thus the developing solution for positive-working photoresist compositions provided by the present invention comprises:

(a) an aqueous medium;

(b) an organic basic compound free from metallic ions; and (c) an acetylene alcohol-based surface active agent in an amount in the range from 50 to 5000 ppm by weight based on the amount of the developing solution.

BRIEF DESCRIPTION OF THE DRAWING

The FIGURE is a graph showing the sensitivity of developing solutions admixed with varied amounts of an acetylene alcohol-based surface active agent as a function of developing temperature.

DETAILED DESCRIPTION OF THE PREFERRED EMBODIMENTS

As is understood from the above given summary, the most characteristic feature of the present invention consists in the admixture of a specified amount of an acetylene alcohol-based surface active agent to a developing solution containing a basic organic compound free from metal ions dissolved in an aqueous medium as the solvent. The base developing solution here implied includes not only aqueous solutions of a basic organic compound alone dissolved in water but also those solutions containing various kinds of known additives conventionally added to developing solutions for positive-working photoresist compositions in addition to the basic organic compound as the principal developing reagent.

The basic organic compound free from metal ions as the principal ingredient of the inventive developing solution may be any of known compounds conventionally used in the developing solutions of this type. Exemplary of such a basic organic compound are aliphatic and aromatic amine compounds such as alkylene diamines, e.g. 1,3-diaminopropane, and aryl amines. e.g. 4,4'-diaminodiphenyl amine, as well as bis(dialkylamino) imines, heterocyclic bases having a ring structure formed of 3 to 5 carbon atoms and 1 or 2 hetero atoms selected from nitrogen, oxygen and sulfur atoms, e.g. pyrrole, pyrrolidine, pyrrolidone, pyridine, morpholine, pyrazine, piperidine, oxazole and thiazole, lower alkyl quaternary ammonium bases and others. Particularly preferable among them are tetramethyl ammonium hydroxide and trimethyl 2-hydroxyethyl ammonium hydroxide, i.e. choline. The above named organic bases free from metal ions can be used either singly or as a combination of two kinds or more according to need.

The inventive developing solution is prepared in the range from 11.0 to 13.5 pH by dissolving the above mentioned basic organic compound in water The optional additives used in conventional developing solutions, which may be contained also in the inventive developing solution, include, in addition to wetting agents, stabilizers and dissolving aids, cationic surface active agents and non-surface active quaternary ammonium compounds, which serve to improve the dissolving selectivity between the exposed and unexposed areas of the positive-working photoresist layer, and monohydric alcohols, which serve to remove scum and foul thin film of the photoresist which may otherwise be left on the exposed areas after development. These optional additives can be added to the solution either singly or as a combination of two kinds or more according to need.

The most characteristic ingredient in the inventive developing solution is an acetylene alcohol-based surface active agent which is a compound represented by the general formula

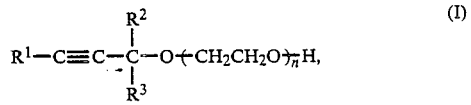

in which $R^1$ is a hydrogen atom or a monovalent group represented by the general formula

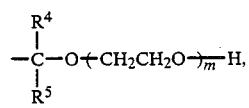

$R^2$, $R^3$, $R^4$ and $R^5$ are each a hydrogen atom or an alkyl group having 1 to 5 carbon atoms and n and m are, each independently from the other, zero or a positive integer not exceeding 20, or the general formula

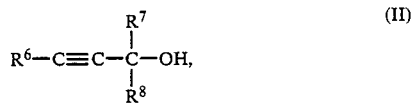

in which $R^6$ is a hydrogen atom or a monovalent group represented by the generally formula

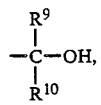

and $R^7$, $R^8$, $R^9$ and $R^{10}$ are each a hydrogen atom or an alkyl group having 1 to 5 carbon atoms.

Several products are commercially available of the acetylene alcohol-based surface active agents of these types as supplied by Air Products and Chemicals Co. with the tradename of surfynols, by Kawaken Fine Chemical Co. with the trade name of Acetylenols, by Dow Chemical Co. and by general Aniline Co. The structural formulas of some of these commercial products are shown below, in which the symbol Me denotes a methyl group.

Surfynol 82: 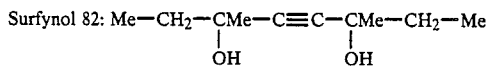

Surfynol 104:

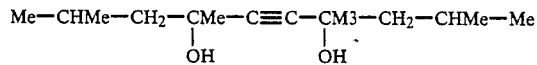

Surfynol 400 Series and Acetylenol:

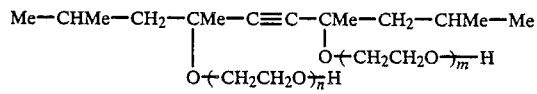

Surfynol 61: 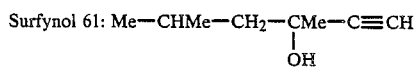

The acetylene alcohol-based surface active agent used in the inventive developing solution is not particularly limited to these products but any of the compounds in conformity with the general formula (I) or (II) given above can be used either singly or as a combination of two kinds or more according to need. Further, surface active agents of other types can be used in combination therewith when a synergistic effect is expected.

The inventive developing solution for positive-working photoresist compositions, of which the principal ingredient is a metal ion-free organic base, should contain the above described acetylene alcohol-based surface active agent in an amount from 50 to 5000 ppm by weight or, preferably, from 100 to 2000 ppm by weight. When the amount thereof is smaller than above, the desired effect of improvement in the wettability of the solution and the effect of defoaming would be insufficient while, when the amount thereof is too large, on the other hand, the pattern of the photoresist layer formed by the development would have somewhat decreased sharpness.

When the acetylene alcohol-based surface active agent is added to the developing solution for positive-working photoresist composition containing a metal ion-free organic base as the principal ingredient, the developing solution can be improved in two respects of increasing the surface activity or wettability and decreasing foams on the solution. When such an improved developing solution is used for patterning a positive-working photoresist layer, quite satisfactory uniform and sharp pattern can be obtained even by stationary development by virtue of the absence of foams and greatly increased spreading velocity of the developing solution over the surface of the photoresist layer.

When the acetylene alcohol-based surface active agent is added to the developing solution for a positive-working photoresist composition containing a metal ion-free organic base as the principal ingredient, in addition, an additional advantage is obtained that the temperature dependency of the dissolving power of the developing solution is decreased so that the latitude of the conditions in the process of development is enlarged contributing to the improvement of the working efficiency. While it is usual that increase in the temperature of the developing solution has an effect of increasing the sensitivity of development with reduction of the film thickness in the unexposed areas when, for example, an alkaline aqueous solution containing choline and the like as an organic base is used as a developing solution in the development of a positive-working photoresist composition of which the photosensitive ingredient is an ester of naphthoquinone diazide sulfonic acid with a polyhydric compound such as alkyl gallates, novolac resins, polyhydroxy benzenes and the like, the temperature dependency of the dissolving power in the process of development can be greatly decreased when a developing solution containing an acetylene alcohol-based surface active agent in combination with tetramethyl ammonium hydroxide is used for a positive-working photoresist composition of which the photosensitive ingredient is an ester of naphthoquinone diazide sulfonic acid with a polyhydroxy benzophenones such as 2,3,4-trihydroxy benzophenone so that the latitude of the conditions in the process of development is enlarged to facilitate process control.

In the following, the developing solution of the invention is illustrated in more detail by way of Examples and Comparative Examples.

EXAMPLES 1 to 10 AND COMPARATIVE EXAMPLES 1 to 6

Two types of base developing solutions for positive-working photoresist compositions were prepared each by dissolving tetramethyl ammonium hydroxide or choline as a metal ion-free organic base in water in a concentration of 2.38% by weight or 4.2% by weight, respectively. These developing solutions have pH value of 13, respectively. Each of these base developing solutions was further admixed with an acetylene alcohol-based surface active agent of Surfynol selected from the grades of Surfynols 61, 82, 104, 440, 465 and 485 in an amount indicated in Table 1 below to give a developing solution according to the invention. The surface active agents of the last-mentioned three grades are each a compound belonging to the Surfynol 400 Series expressed by the structural formula previously given therefor, in which the subscripts of m and n have different values according to the manufacturer Air Products and Chemicals Co. In the comparative examples, the developing solution was either one of the base developing solutions as such without addition of the acetylene alcohol-based surface active agent (Comparative Example 1 to 5) or, instead thereof, with addition of 500 ppm of isopropyl alcohol (Comparative Example 6).

Semiconductor silicon wafers of 4 inch diameter were each coated on a spinner (Resist Coater TR-4000, manufactured by Tatsumo Co.) with a positive-working photoresist composition (OFPR-5000, a product by Tokyo Ohka Kogyo Co.) in a coating thickness of 1.3 μm as dried followed by pre-baking at 110° C. for 90 seconds on a hot plate to form a photoresist layer. The silicon wafer provided with the photoresist layer was exposed to light pattern-wise through a test chart (manufactured by DaiNippon Printing Co.) on an exposure machine by minifying projection (Model DSW 4800, manufactured by GCA Co.) and then subjected to stationary development at 23° C. in an apparatus for stationary development (manufactured by Tokyo Ohka Kogyo Co.) using one of the above prepared developing solutions followed by rinse with pure water for 30 seconds and drying by blowing of nitrogen gas.

The quality of the pattern-wise photoresist layer on each silicon wafer was microscopically examined to give the results shown in Table 1 rated in A, B and C according to the following criteria.

A: The condition of developed pattern was quite satisfactory with uniform line width over the whole surface.

B: The condition of developed pattern was acceptable although no good uniformity was obtained in the line width over the whole surface.

C: The condition of developed pattern was unacceptable.

In Table 1, the types of the base developing solutions are indicated with the symbols T and C for the solutions containing 2.38% by weight of tetramethyl ammonium hydroxide and 4.2% by weight of choline, respectively.

As is clear from the results shown in Table 1, all of the developing solutions admixed with an acetylene alcohol-based surface active agent gave quite satisfactory results even when the development time was 20 seconds. On the contrary, satisfactory results of development could be obtained with a developing solution containing no acetylene alcohol-based surface active agent only when the development time was extended to 60 seconds.

TABLE 1

| | Type of base solution | Surface active agent Grade | Concentration, ppm | Development time, seconds | Quality of patterned layer |
|---|---|---|---|---|---|
| Comparative Example 1 | T | — | — | 20 | C |
| Comparative Example 2 | T | — | — | 30 | C |
| Comparative Example 3 | T | — | — | 40 | B |
| Comparative Example 4 | T | — | — | 60 | A |
| Example 1 | T | Surfynol 465 | 200 | 20 | A |
| Example 2 | T | Surfynol 465 | 500 | 20 | A |
| Example 3 | T | Surfynol 440 | 200 | 20 | A |
| Comparative Example 5 | C | — | — | 30 | C |
| Example 4 | C | Surfynol 465 | 200 | 20 | A |
| Example 5 | C | Surfynol 465 | 2000 | 20 | A |
| Comparative Example 6 | T | —* | — | 30 | C |
| Example 6 | T | Surfynol 485 | 1000 | 20 | A |
| Example 7 | T | Surfynol 82 | 500 | 20 | A |
| Example 8 | T | Surfynol 104 | 200 | 20 | A |
| Example 9 | T | Surfynol 61 | 500 | 20 | A |
| Example 10 | T | Surfynol 465 | 2000 | 20 | A |

*500 ppm of isopropyl alcohol added

EXAMPLE 11

Developing solutions according to the invention were prepared by admixing a base developing solution for positive-working photoresist compositions, which was an aqueous solution of tetramethyl ammonium hydroxide as a metal ion-free organic base in a concentration of 2.38% by weight, this developing solution has pH value of 13, with 200 ppm, 500 ppm or 1000 ppm of an acetylene alcohol-based surface active agent (Surfynol 465, supra). Each of the thus prepared developing solutions including the base solution was used for the development of the photoresist layers formed on several silicon wafers and exposed to light patternwise in the same manner as in the preceding examples. The temperature of development was varied in the rang from 15° to 40° C. with 5° C. intervals to determine the sensitivity which was the minimum exposure time in milliseconds required for obtaining a reproduction of the patternwise image with high fidelity. The results are shown in the figure of the accompanying drawing from which it is understood that the sensitivity of the developing solution has an apparently decreased temperature dependency by the addition of the acetylene alcohol-based surface active agent.

According to the results of the above described examples, the developing solution of the invention is very advantageous in respect of the remarkably improved uniformity of the patterned layer of a positive-working photoresist formed on a silicon wafer. The quality of the patterned photoresist layer is satisfactory even when the development time is almost as half as in the use of conventional developing solutions. For example, the development time with the inventive developing solution can be as short as 30 seconds while a conventional solution requires 60 seconds for obtaining the same results. Furthermore, the addition of the acetylene alcohol-based surface active agent to a developing solution has an effect to decrease the temperature dependency of the solution so that the latitude of the conditions is greatly enlarged in the process of development. In addition, the developing solution of the invention has a defoaming effect so that unevenness of development due to foams can be prevented even in an in-line development apparatus for stationary development. Namely, the present invention provides a solution for the difficult problem in the conventional developing solutions due to foaming taking place in the course of preparation of the solution including the steps of mixing, filtering and bottling.

What is claimed is:

1. A one-step developing solution for positive-working photoresist compositions which comprises:
  (a) an aqueous medium;
  (b) an organic base compound free from metallic ions selected from the group consisting of tetraalkyl ammonium hydroxide and choline in an amount sufficient to obtain a pH of between 11.0 and 13.5; and
  (c) 50 to 5000 ppm by weight, based on the amount of the developing solution, of a acetylene alcohol-based surface active agent selected from the group consisting of the compounds represented by the general formula I:

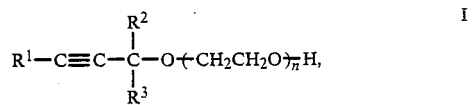

wherein $R^1$ is a hydrogen atom or a monovalent group represented by the general formula II

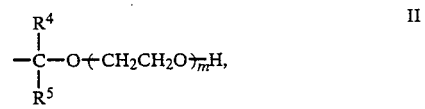

$R^2$, $R^3$, $R^4$ and $R^5$ are each a hydrogen atom or an alkyl group having 1 to 5 carbon atoms, and n and m are, each independently from the other, zero or a positive integer not exceeding 20, and the compounds represented by the general formula III

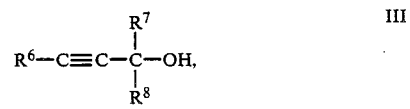

wherein $R^6$ is a hydrogen atom or a monovalent group represented by the general formula—$C_r^9 R^{10}OH$, and $R^7$, $R^8$, $R^9$ and $R^{10}$ are each a hydrogen atom or an alkyl group having 1 to 5 carbon atoms.

* * * * *